(12) United States Patent
Mizutani et al.

(10) Patent No.: US 7,615,115 B2
(45) Date of Patent: Nov. 10, 2009

(54) LIQUID-PHASE GROWTH APPARATUS AND METHOD

(75) Inventors: Masaki Mizutani, Nara (JP); Katsumi Nakagawa, Kyoto (JP); Takehito Yoshino, Nara (JP); Shoji Nishida, Nara (JP)

(73) Assignee: Canon Kabushiki Kaisha, Tokyo (JP)

( * ) Notice: Subject to any disclaimer, the term of this patent is extended or adjusted under 35 U.S.C. 154(b) by 0 days.

(21) Appl. No.: 12/168,464

(22) Filed: Jul. 7, 2008

(65) Prior Publication Data
US 2009/0000540 A1    Jan. 1, 2009

Related U.S. Application Data

(62) Division of application No. 11/270,562, filed on Nov. 10, 2005, now Pat. No. 7,407,547, which is a division of application No. 10/385,457, filed on Mar. 12, 2003, now Pat. No. 7,014,711.

(30) Foreign Application Priority Data
Mar. 29, 2002   (JP)   ............... 2002-095997

(51) Int. Cl.
    *C30B 19/00*   (2006.01)
(52) U.S. Cl. .............. 117/54; 117/57; 117/61; 117/200; 117/206
(58) Field of Classification Search ........... 117/54, 117/57, 61, 200, 206
    See application file for complete search history.

(56) References Cited

U.S. PATENT DOCUMENTS

| | | | |
|---|---|---|---|
| 3,648,653 A * | 3/1972 | Vehse ..................... 118/416 |
| 3,752,118 A | 8/1973 | Solomon et al. ............ 118/422 |
| 4,243,472 A * | 1/1981 | O'Neill ..................... 117/60 |
| 4,354,453 A | 10/1982 | Koike et al. ................ 118/425 |
| 5,362,683 A * | 11/1994 | Takenaka et al. ............ 438/458 |
| 5,922,126 A * | 7/1999 | Furukawa et al. ............ 117/54 |
| 6,231,667 B1 | 5/2001 | Iwane et al. .................. 117/55 |
| 6,391,108 B2 | 5/2002 | Nishida et al. ................ 117/77 |
| 6,551,908 B2 | 4/2003 | Noritaka et al. ............ 438/478 |
| 2002/0092464 A1* | 7/2002 | Nakagawa et al. ............ 117/94 |
| 2002/0112660 A1 | 8/2002 | Nishida et al. ................ 117/54 |

* cited by examiner

Primary Examiner—Robert M Kunemund
Assistant Examiner—Matthew J Song
(74) Attorney, Agent, or Firm—Fitzpatrick, Cella, Harper & Scinto

(57) ABSTRACT

A liquid-phase growth apparatus for growing a crystal on a substrate includes a crucible containing a solution that contains a raw material for forming the crystal, and a substrate holder for vertically holding the substrate. The substrate holder includes connectors, a receiving component, and a push component. The receiving component and the push component are opposite to each other and are connected by the connectors. The push component holds an upper portion of the substrate while the receiving component holds a lower portion of the substrate. The substrate holder containing the vertically held substrate is dipped into the solution. The receiving component ascends with buoyancy in the solution contained in the crucible, so that the substrate is now held securely and prevented from cracking due to thermal expansion.

4 Claims, 5 Drawing Sheets

LIQUID-PHASE GROWTH APPARATUS AND METHOD

This application is a division of application Ser. No. 11/270,562, filed on Nov. 10, 2005, now issued as U.S. Pat. No. 7,407,547, which, in turn is a division of application Ser. No. 10/385,457, filed on Mar. 12, 2003, now issued as U.S. Pat. No. 7,014,711.

BACKGROUND OF THE INVENTION

1. Field of the Invention

The present invention relates to a liquid-phase growth apparatus for growing a crystal on a seed substrate that is vertically held with a substrate holder and is dipped in a solution containing a solute (raw material) for forming the crystal in a crucible, and to a liquid-phase crystal growth method using the apparatus.

2. Description of the Related Art

Liquid-phase growing is known as a method for preparing a high-quality monocrystalline thin film at relatively low temperature. Unfortunately, in a dipping process that includes dipping a substrate held with a substrate holder in a solution, films are deposited on two faces of the substrate.

Some methods are proposed for depositing a thin film only on one face of the substrate. For example, a substrate is placed on a platinum holder and fixed with fixing claws to inhibit growth of the film on the rear face of the substrate. In another proposed method, two substrates that are in close contact with each other at the rear faces are dipped in a solution to facilitate crystal growth on the front faces of the substrates.

In liquid-phase crystal growth by general dipping, the substrate is held to the substrate holder horizontally or at a slight tilt angle from the level line. In such a case, a thicker film is deposited on the down face of the substrate rather than the upper face. In particular, this tendency is noticeable in liquid-phase growth of a silicon crystal from an indium solvent since the specific gravity of the material (silicon) for forming the crystal is considerably lower than that of the solvent.

When the substrate is vertically held in a general dipping method, films may be formed on two faces of the substrate or the substrate may be cracked by thermal expansion.

SUMMARY OF THE INVENTION

The present invention provides a liquid-phase growth apparatus and a method that can restrain cracking by thermal expansion of a vertically held substrate dipped in a solution.

The present invention preferably provides a liquid-phase growth apparatus and a method that can suppress crystal growth on the rear face of a substrate.

According to a first aspect of the present invention, a liquid-phase growth apparatus for growing a crystal on a substrate includes a crucible containing a solution that contains a raw material for forming the crystal; and a substrate holder for vertically holding the substrate. The substrate holder includes connectors; and a receiving component and a push component which are opposite to each other and are connected by the connectors. The push component holds an upper portion of the substrate while the receiving component holds a lower portion of the substrate. The receiving component ascends with buoyancy in the solution contained in the crucible.

Preferably, the push component and the receiving component have grooves for holding two ends of the substrate. Preferably, each of the grooves has inclined planes for guiding each end of the substrates.

Preferably, the push component is vertically movable and holds the substrate together with the receiving component by own weight of the push component when the substrate is not dipped in the solution.

Preferably, the receiving component has a window that facilitates circulation of the solution.

Preferably, the substrate holder holds a plurality of the substrates arranged radially at a predetermined interval in the circumferential direction of the crucible.

A plurality of the receiving components and a plurality of push components may be alternately connected in the vertical direction with long connectors.

According to a second aspect of the present invention, there is provided a liquid-phase growth method for growing a crystal on a substrate that is dipped in a solution containing a raw material for forming the crystal in a crucible. The method includes holding a substrate vertically between a receiving component and a push component that are connected with connectors, wherein the push component and the receiving component hold the substrate by buoyancy of the receiving component when the substrate is dipped into the solution.

Preferably, two substrates are put into contact with each other at the rear faces thereof or with a face of a dummy plate, and the two substrates or the substrate and the dummy plate are held between the push component and the receiving component.

Preferably, the two substrates or the substrate and the dummy plate are put into close contact with each other by buoyancy of the receiving component.

Preferably, the push component is vertically movable and vertically holds the substrate together with the receiving component by own weight of the push component when the substrate is not dipped in the solution.

According to a third aspect of the present invention, a liquid-phase growth apparatus for growing a crystal on a substrate includes a crucible containing a solution that contains a raw material for forming the crystal; and a substrate holder for vertically holding the substrate. The substrate holder includes connectors; and a receiving component and a push component which are opposite to each other and are connected by the connectors. The push component holds an upper portion of the substrate while the receiving component holds a lower portion of the substrate. The receiving component has a V groove at a surface opposite to the push component, and the push component has an inverted V groove at a surface opposite to the receiving component, the V groove facing the inverted V groove, the receiving component holding a lower edge of the substrate while the push component holds an upper edge of the substrate. The receiving component is loosely connected to the push component with the connectors so as to be vertically movable so that the receiving component comes down by the own weight when the substrate holder is not dipped in the solution and comes up by buoyancy thereof when the substrate holder is dipped in the solution.

Preferably, the total specific gravity of movable components including the receiving component is smaller than that of the solution in the crucible.

Preferably, the push component is vertically movable and has downward force by own weight to hold the substrate vertically with the receiving component when the substrate is not dipped in the solution.

According to the present invention, when the substrate is heated or vertically dipped into the solution it will not crack by thermal expansion in the preheating process or in the dipping process in the solution. That is, the thermal expansion of the substrate is absorbed by the tolerance of the vertically movable push component.

Since the two substrates or the substrate and the dummy plate are put into close contact in the solution, film deposition does not occur on the rear face(s) of the substrate(s), irrespective of vertical arrangement of the substrate(s) in the solution.

Furthermore, the push component presses the substrate by its own weight when the substrate is not dipped into the solution. Thus, the substrate can be easily put in position. Furthermore, the push component puts the substrate into close contact with another substrate or a dummy plate when these are dipped into the solution. Thus, the solution does not enter the rear face(s) of the substrate(s).

In this apparatus, the solution is uniformly circulated in the crucible. Thus, the film deposited on the substrate has a uniform thickness.

Other features and advantages of the present invention will be apparent from the following description of taken in conjunction with the accompanying drawings.

DESCRIPTION OF THE PREFERRED EMBODIMENTS

The preferred embodiments of the present invention will now be described with reference to the drawings. However, the present invention is not limited to these embodiments and may include various modifications.

Figure 1:
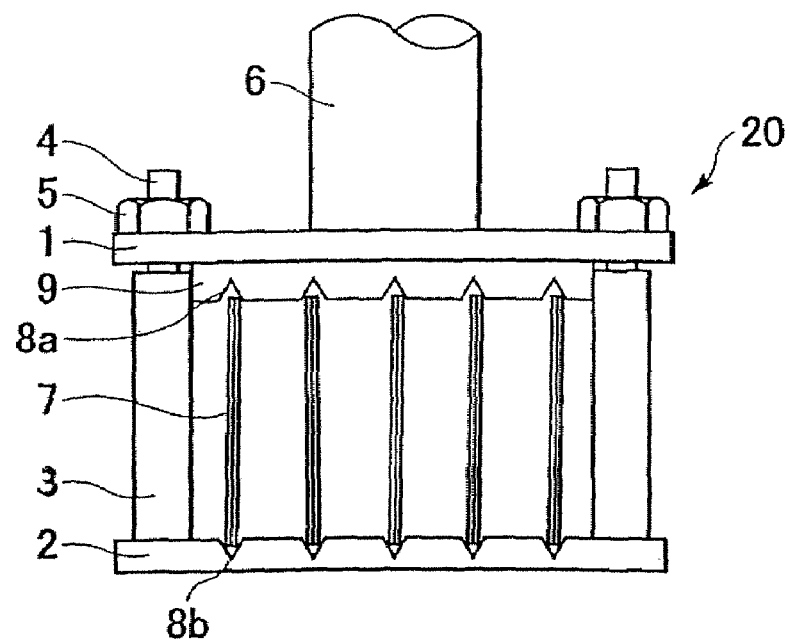
FIG. 1 is a schematic cross-sectional view of a substrate holder unit in a liquid-phase growth apparatus according to an embodiment of the present invention.

FIG. 1 is a schematic cross-sectional view of a substrate holder unit 20 in a liquid-phase growth apparatus according to an embodiment of the present invention. The substrate holder unit 20 primarily includes a push component 1 and a receiving component 2 that are arranged in parallel at a predetermined distance. The substrate holder unit 20 further includes connectors 3 that connect the push component 1 and the receiving component 2. The receiving component 2 has a plurality of V grooves 8b on its top face. The push component 1 has a protruding segment 9 at its bottom. The protruding segment 9 has a plurality of inverted V grooves 8a on its bottom face, the inverted V grooves 8a facing the respective V grooves 8b. Two substrates 7 that are in closed contact with each other at the rear faces are vertically held between an inverted V groove 8a and the corresponding V groove 8b. The substrates 7 may be slightly tilted.

The connectors 3 are vertically fixed at the two ends of the receiving component 2. Each connector 3 has a screw 4 at the top. The push component 1 has two opening (not shown) at the both ends. Each connector 3 extends through the corresponding opening of the push component 1 and is fixed with a screw nut 5. The connectors 3 may be fixed with any fixing bracket other than the screw nuts 5, for example, with pins.

FIG. 1 shows an arrangement of the substrates 7 before liquid-phase growth. It is important that the screw nuts 5 are not completely tightened to hold the substrates, but are slightly loosened such that the receiving component 2 can slightly moves vertically and that the substrates 7 are held with slackness and do not detached from the inverted V grooves 8a. A vertically movable shaft 6 is fixed to the upper center of the push component 1. After the substrates 7 are placed between the inverted V grooves 8a and the V grooves 8b, the shaft 6 moves vertically to dip the substrates 7 into a solution for liquid-phase growth. In a typical liquid-phase growth method, the substrates 7 are preliminarily heated and then dipped into the solution. Even if the substrates 7 thermally expand, the allowance of the inverted V grooves 8a prevents the substrates 7 from cracking.

Figure 2:
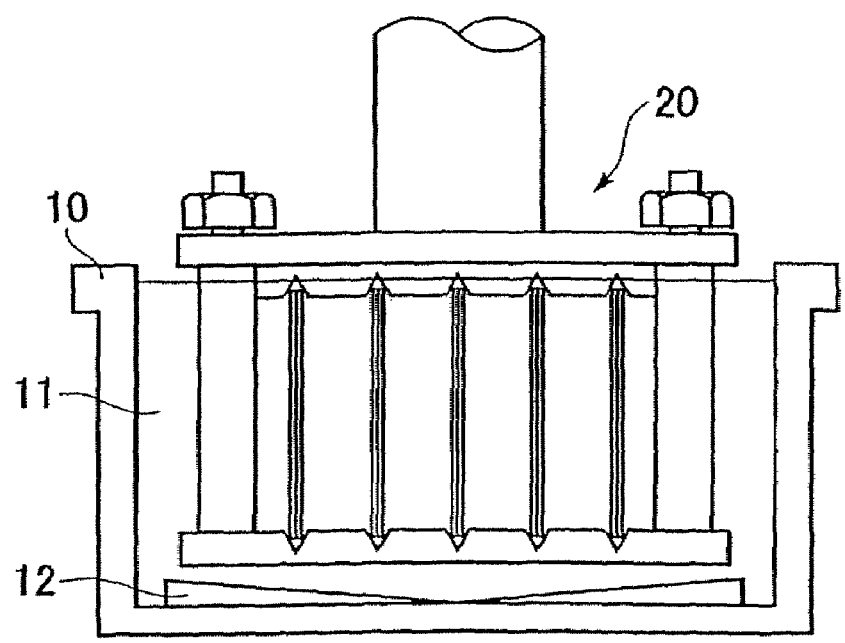
FIG. 2 is a schematic cross-sectional view of a substrate holder unit when substrates are dipped in a solution contained in a crucible in an embodiment of the present invention.

FIG. 2 is a schematic cross-sectional view of the substrate holder unit 20 when the substrates 7 are dipped in a solution 11 contained in a crucible 10. As shown in FIG. 2, the substrates 7 are held between the push component 1 and the receiving component 2 while the shaft 6 is moved downward to dip the substrates 7 into the solution 11. The receiving component 2 and the connectors 3 are formed of a material or materials that have a smaller specific gravity than that of the solution 11. Thus, these components ascend and push up the substrates 7 by buoyancy in the solution 11. In this situation, the two lapped substrates 7 are tightly fixed to the corresponding inverted V groove 8a, so that the rear faces of these substrates 7 are not exposed to the solution 11. The V grooves 8b and the inverted V grooves 8a may be replaced with grooves and inverted grooves having inclined planes that cause contact force between the lapped substrates 7.

In this liquid-phase growth apparatus, adequate buoyancy acting on the receiving component 2 maintains close contact of the lapped substrates 7 even if the substrates 7 expand or contract in the solution.

preferably, the solution 11 is stirred without rotation of the substrate holder unit 20 to maintain the stable vertical arrangement of the substrates 7. A stirring impeller 12 provided on the bottom of the crucible 10 rotates to circulate the solution 11 vertically in the crucible 10.

Figure 3:
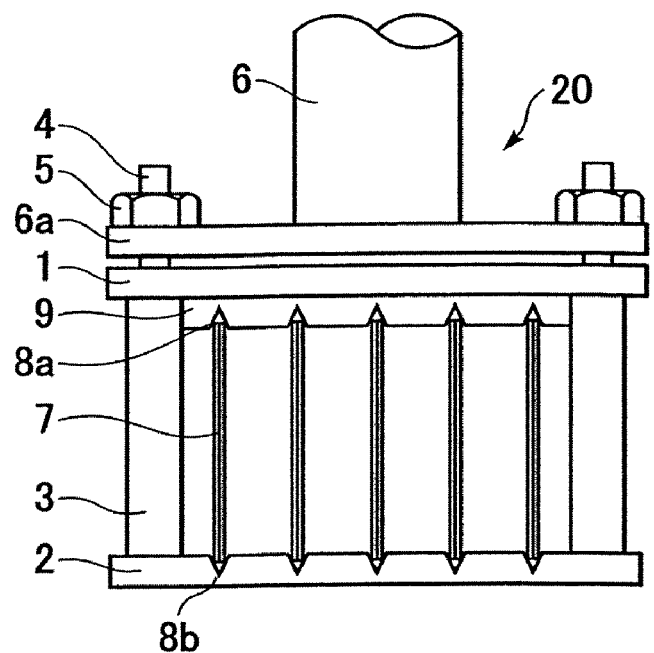
FIG. 3 is a schematic cross-sectional view of a substrate holder unit in a liquid-phase growth apparatus according to another embodiment of the present invention.

FIG. 3 is a schematic cross-sectional view of a substrate holder unit 20 in a liquid-phase growth apparatus according to another embodiment of the present invention. A push component 1 is not fixed to a shaft 6 and thus is vertically movable within a predetermined length. More specifically, screws 4 of connectors 3 extend through openings (not shown) at both ends of the push component 1 and openings (not shown) at both ends of a fixing plate 6a, and are fixed to the fixing plate 6a with screw nuts 5. A vertically movable shaft 6 is fixed to the upper center of the fixing plate 6a.

As described above, it is important that the screw nuts 5 are not completely tightened, but are slightly loosened such that the push component 1 and the receiving component 2 can slightly move vertically. In this embodiment, the push component 1 presses the substrates 7 by its own weight when the substrates 7 are not dipped into a solution 11. Thus, the substrates 7 can be easily put in position. Furthermore, the allowance and tolerance of the push component 1 prevents the expanded substrates 7 from cracking.

Figure 4:
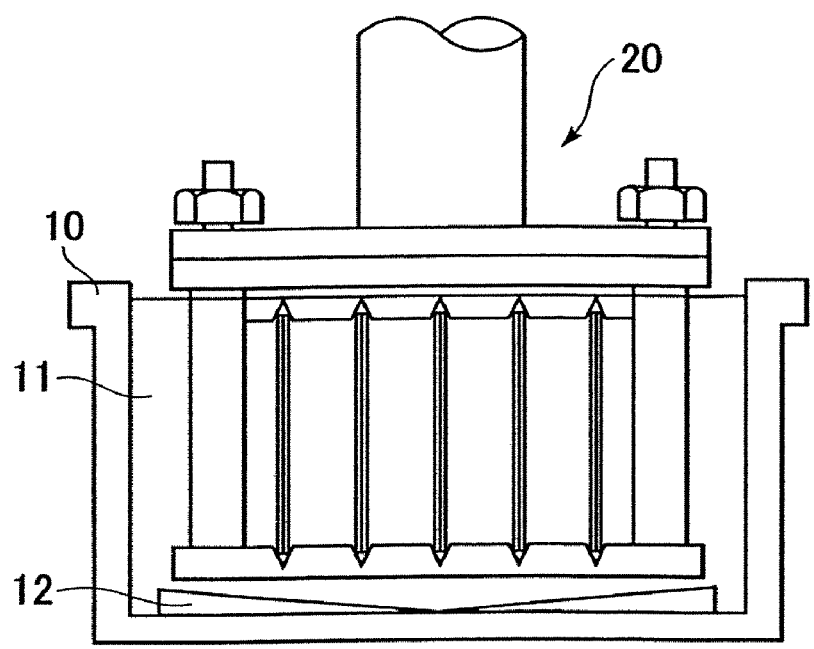
FIG. 4 is a schematic cross-sectional view of a substrate holder unit when substrates are dipped in a solution contained in a crucible in an embodiment of the present invention.

FIG. 4 is a schematic cross-sectional view of a substrate holder unit 20 when substrates 7 are dipped in a solution 11 contained in a crucible 10, in accordance with another embodiment of the present invention. A receiving component 2 and connectors 3 ascend and push up the substrates 7 together with a push component 1 by buoyancy in the solution 11. The substrates 7 are always held between inverted V grooves 8a and V grooves 8b both when the substrates 7 are dipped and not dipped in the solution 11, so that the two lapped substrates 7 are in close contact with each other.

In the substrate holder unit 20 of the liquid-phase growth apparatus according to the present invention, components that are dipped in the solution are composed of materials having a specific gravity smaller than that of the solution and having high heat resistance. Examples of such materials include quartz and graphite carbon. The width and the depth of the inverted V grooves 8a and the V grooves 8b may be determined depending on the thickness of the substrates 7. The push component 1 may have inverted grooves, in place of the inverted V grooves 8a of the protruding segment 9. Alternatively, grooves may be formed on a bank plate provided on the receiving component 2, in place of the V grooves 8b on the receiving component 2. The bank plate corresponds to the protruding segment 9.

In the above embodiments, the rear faces of the two substrates 7 are in contact with each other. Alternatively, one substrate 7 may be put into contact with a dummy plate having substantially the same size. The dummy plate may be composed of, for example, quartz or graphite carbon. Alternatively, two substrates may be placed on the both faces of the dummy plate.

Figure 5:
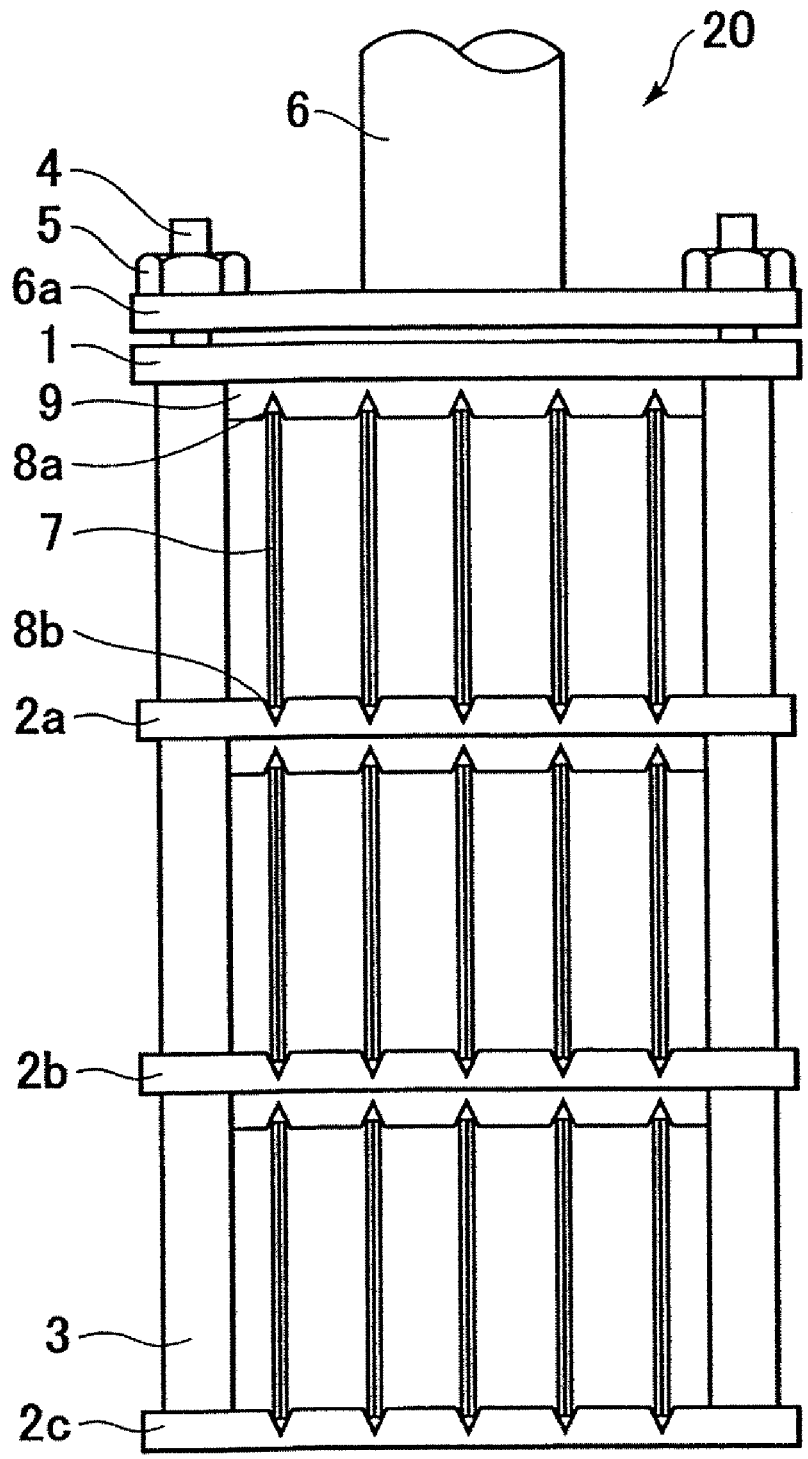
FIG. 5 shows a vertical triple arrangement of the substrate holder units shown in FIGS. 3 and 4.

FIG. 5 shows a triple arrangement of the substrate holder units shown in FIGS. 3 and 4. Receiving components 2a and 2b also function as push components of the lower stages. Long connectors 3 are vertically fixed to a receiving component 2c at the bottommost stage. Each connector 3 extends through openings (not shown) of the receiving components 2a and 2b, a push component 1, and a fixing plate 6a, and is fixed to the fixing plate 6a with a screw nut 5 tightened around a screw 4. The connectors 3 may be detachable from the receiving component 2c.

Figure 6:
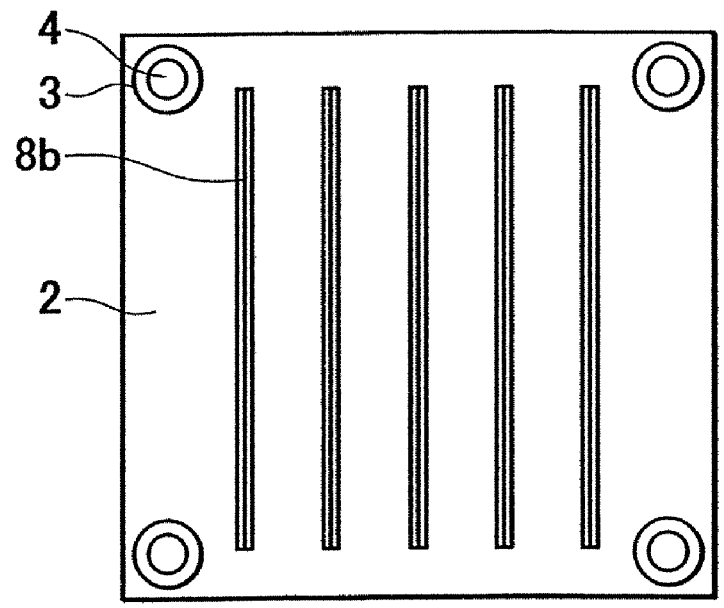
FIG. 6 is a top view of the receiving component shown in any one of FIGS. 1 to 4.

FIG. 6 is a top view of the receiving component 2 shown in FIGS. 1 to 4. The V grooves 8b that are tailored to the size of the substrates are arranged in parallel on the surface of the square or rectangular receiving component 2.

Figure 7:
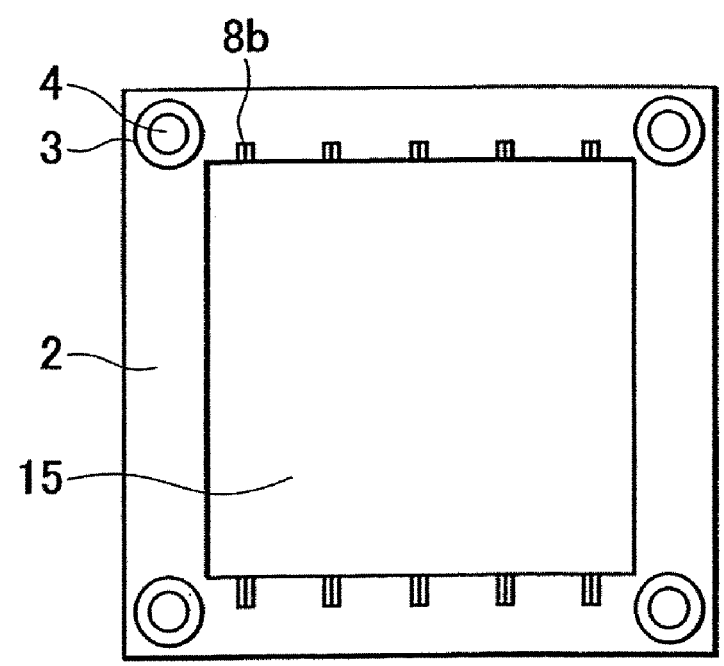
FIG. 7 is a top view of a receiving component having a window of a liquid-phase growth apparatus according to another embodiment.

FIG. 7 is a top view of the receiving component 2 according to another embodiment. In this embodiment, V grooves 8b are arranged to support only both ends of each substrate. The center of the receiving component 2 is cut out to form a window 15. The window 15 facilitates vertical circulation of the solution. Furthermore, the receiving component 2 prevents overflow of the solution from the crucible when the substrates are dipped into the solution and significantly reduces the volume of the solution that is carried away from the crucible when the substrates are pull out of the solution.

Figure 8:
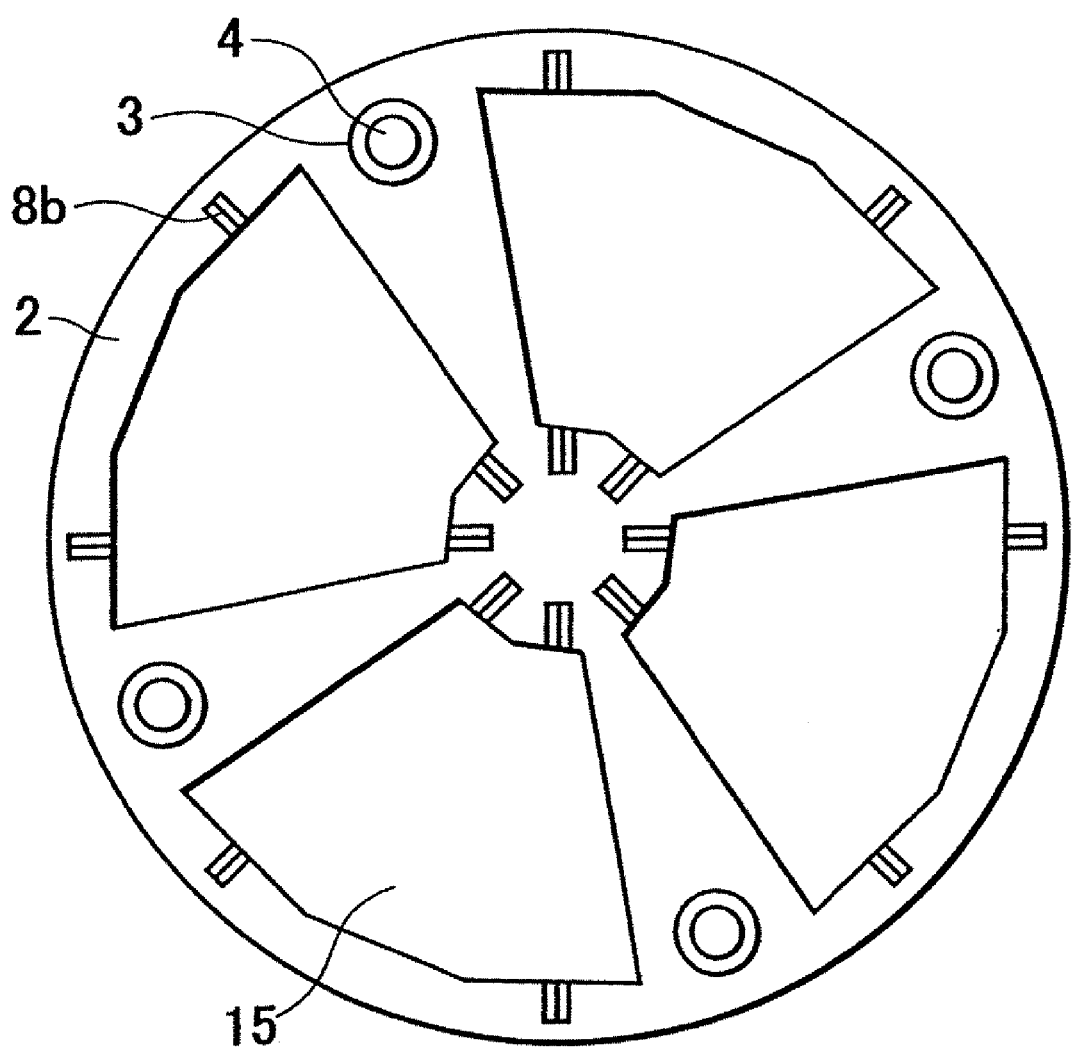
FIG. 8 is a top view showing a radial arrangement of substrates on a receiving component of a liquid-phase growth apparatus according to the present invention.

FIG. 8 is a modification of the receiving component 2 shown in FIG. 7. In this modification, substrates are disposed radially. When a cylindrical crucible is used in the modification, the solution is uniformly circulated between these substrates.

The liquid-phase growth apparatus according to the present invention can be applied to liquid phase epitaxial (LPE) growth of various materials. For LPE growth of magnetic garnet used in magneto-optical devices, the solution 11 is a melt of $PbO$ and $B_2O_3$ as solvents and raw garnet as a solute. For LPE growth of lithium niobate used in nonlinear optical devices, the solution 11 is a melt of $LiO_2$, $Nb_2O_5$, and $V_2O_5$. For LPE growth of GaAs, a group III-V compound semiconductor, used in oscillating devices or light-emitting devices, the solution 11 is a melt of Ga as a solvent, polycrystalline GaAs as a solute, and Si and the like as dopants. For LPE growth of Si used in semiconductor ICs and solar cells, the solution 11 is a melt of Sn, In, Al, or Cu as a solvent, Si as a solute (raw material), and B, Al, P, or As as a dopant.

Example

A nonlimiting example of the present invention will now be described. The liquid-phase growth apparatus according to the present invention was used for forming a monocrystalline silicon thin film. Substrates were disposed radially as shown in FIG. 8.

Substrates 7 were p+ silicon substrates having a square shape with a side of 125 mm and a thickness of 0.6 mm. Each silicon substrate was anodized to form a porous surface layer with a thickness of 12 μm. Rear faces of two substrates were put into close contact with both surfaces of a quartz square dummy plate with a side of 125 mm and a thickness of 0.6 mm, and this substrate combination was placed into the substrate holder unit 20. The receiving component 2 was composed of quartz and had a diameter of 350 mm and a thickness of 5 mm. The receiving component 2 had V grooves 8b that supported 5 mm from each end of the substrate combination. Each V groove 8b had a width of 2.5 mm and a cross-sectional angle of 60°. The V grooves 8b were radially arranged at an interval of 4.5° to place 80 substrate combinations radially.

Four receiving components were stacked as shown in FIG. 5 to hold 640 substrates. A solution 11 containing 550 kg of indium and 5.5 kg of gallium (solvents) was placed into a quartz crucible 10 with an inner diameter of 400 mm and a depth of 600 mm, and 17.5 kg of silicon (solute) was saturated to the solution at 930° C. and the solution was cooled to 923° C. to form a supersaturated solution.

After the substrates 7 were annealed with hydrogen at 1,050° C. for 20 minutes, they were dipped into the solution 11. While the stirring impeller 12 in the crucible 10 was rotated at 10 rpm to circulate the solution 11 vertically, the solution 11 was cooled at a cooling rate of 2° C./min. Sixty minutes later, a monocrystalline silicon film with a thickness of 80 μm was prepared.

While the present invention has been described with reference to what are presently considered to be the preferred embodiments, it is to be understood that the invention is not limited to the disclosed embodiments. On the contrary, the invention is intended to cover various modifications and equivalent arrangements included within the spirit and scope of the appended claims. The scope of the following claims is to be accorded the broadest interpretation so as to encompass all such modifications and equivalent structures and functions.

What is claimed is:

1. A liquid-phase growth method for growing a crystal on a substrate that is dipped in a solution containing a raw material for forming the crystal in a crucible, the method comprising:
   holding a substrate vertically between a receiving component and a push component that are connected with connectors,
   wherein the push component and the receiving component hold the substrate by buoyancy of the receiving component when the substrate is dipped into the solution.

2. The method according to claim 1, wherein two substrates are put into contact with each other at the rear faces thereof or with a face of a dummy plate, and the two substrates or the substrate and the dummy plate are held between the push component and the receiving component.

3. The method according to claim 2, wherein the two substrates or the substrate and the dummy plate are put into close contact with each other by buoyancy of the receiving component.

4. The method according to claim 1, wherein the push component is vertically movable and vertically holds the substrate together with the receiving component by own weight of the push component when the substrate is not dipped in the solution.

* * * * *